US005136359A

United States Patent [19]

Takayama et al.

[11] Patent Number: 5,136,359

[45] Date of Patent: Aug. 4, 1992

[54] ANISOTROPIC CONDUCTIVE FILM WITH THROUGH-HOLES FILLED WITH METALLIC MATERIAL

[75] Inventors: Yoshinari Takayama; Amane Mochizuki; Atsushi Hino; Kazuo Ouchi; Masakazu Sugimoto, all of Osaka, Japan

[73] Assignee: Nitto Denko Corporation, Osaka, Japan

[21] Appl. No.: 629,897

[22] Filed: Dec. 19, 1990

[30] Foreign Application Priority Data

Dec. 19, 1989 [JP] Japan .......................... 1-330052

[51] Int. Cl.[5] .................. H01L 23/48; H01L 49/00; H01L 29/40; H01L 29/46

[52] U.S. Cl. .................................. 357/65; 357/67; 357/85

[58] Field of Search .......................... 357/65, 67, 85

[56] References Cited

U.S. PATENT DOCUMENTS 4,970,571 11/1990 Yamakawa et al. .............. 357/65
4,996,581 2/1991 Hamasaki .......................... 357/65
5,027,188 6/1991 Owada et al. ...................... 357/65

FOREIGN PATENT DOCUMENTS 0213774 3/1987 European Pat. Off. .
221903 5/1985 Fed. Rep. of Germany .
63-40218 2/1988 Japan .
63-94504 4/1988 Japan .

*Primary Examiner*—Rolf Hille
*Assistant Examiner*—Mahshid Saadat
*Attorney, Agent, or Firm*—Sughrue, Mion, Zinn Macpeak & Seas

[57] ABSTRACT

An anisotropic conductive film is disclosed, comprising an insulating film having fine through-holes independently piercing the film in the thickness direction, each of the through-holes being filled with a metallic substance in such a manner that at least one end of each through-hole has a bump-like projection of said metallic substance having a bottom area larger than the opening of the through-hole. The metallic substance serving as a conducting path is prevented from falling off, and sufficient conductivity can be thus assured.

4 Claims, 1 Drawing Sheet

ANISOTROPIC CONDUCTIVE FILM WITH THROUGH-HOLES FILLED WITH METALLIC MATERIAL

FIELD OF THE INVENTION

The present invention relates to an anisotropic conductive film having high reliability in electrical connection and a process for producing the same.

BACKGROUND OF THE INVENTION

In the field of semi-conductors, with the recent development of electronic equipment having multiple functions, a reduced size and a reduced weight, a circuit has become denser, and a fine circuit pattern having many pins at a narrow pitch has been used. In order to cope with the demand for fineness of a circuit pattern, it has been attempted to connect a plurality of conducting patterns formed on a substrate and a conducting pattern or an Integrated Circuit (IC) or an Large Scale Integration (LSI) via a anisotropic conductive film therebetween.

For example, JP-A-55-161306 (the term "JP-A" as used herein means an "unexamined published Japanese patent application") discloses an anisotropic conductive sheet comprising an insulating porous sheet in which the fine through-holes of a selected area are metal-plated. On connecting an IC, etc., since the sheet has no metallic projections on its surface, it is necessary to form a projected electrode (bump) on the IC on the connecting pad side, making the connection step complicated.

In an attempt to facilitate connection, as shown in FIG. 2, it has been proposed to fill a metallic substance 3 in fine through-holes 2 of an insulating sheet 1 formed in the thickness direction in such a manner that the resulting anisotropic conductive film has metallic bumps 4 projected from the film surface, as disclosed in JP-A-62-43008, JP-A-63-40218, and JP-A-63-94504. However, adhesion between filled metallic substance 3 and insulating film 1 is not so sufficient that the metallic substance is apt to fall off. It follows that the fine through-holes, which ought to exhibit conductivity, fail to exhibit conductivity and lack reliability in electrical connection.

SUMMARY OF THE INVENTION

An object of the present invention is to provide an anisotropic conductive film which surely exhibits anisotropic conductivity to assure high reliability in electrical connection.

Another object of the present invention is to provide a process for producing the above anisotropic conductive film.

Other objects and effects of the present invention will be apparent from the following description.

As a result of extensive investigations, the inventors have found that the above objects of the present invention are accomplished by an anisotropic conductive film comprising an insulating film having fine through-holes independently piercing the film in the thickness direction of the insulating film, each of the through-holes being filled with a metallic substance in such a manner that at least one end of each through-hole has a bump-like projection of the metallic substance having a bottom area larger than the opening of the through-hole.

DETAILED DESCRIPTION OF THE INVENTION

The present invention is now explained by referring to the accompanying drawings.

Figure 1:
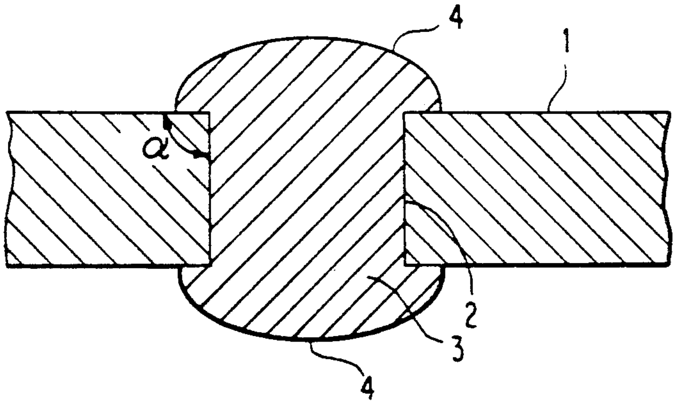
FIG. 1 illustrates a cross section of the anisotropic conductive film according to one embodiment of the present invention.
Figure 2:
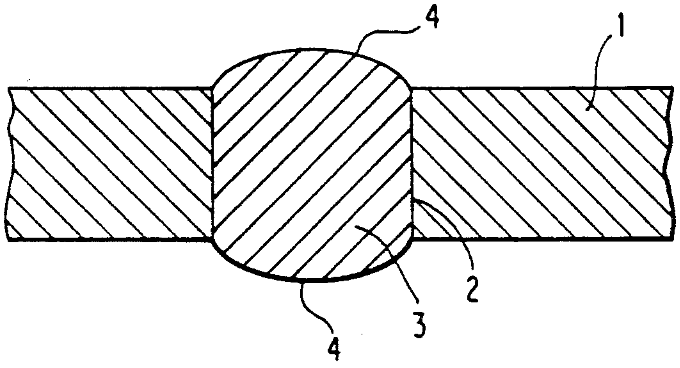
FIG. 2 PRIOR ART
FIG. 2 illustrates a cross section of a conventional anisotropic conductive film having bumps.

FIG. 1 shows a cross section of the anisotropic conductive film according to one embodiment of the present invention. In FIG. 1, insulating film 1 has fine through-holes 2 which pierce the film in the thickness direction. A conducting path filled with metallic substance 3 reaches both the obverse and the reverse of the film. On each end of each through-hole 2 there is provided a metallic bump-like projection 4 having a larger bottom area than the opening area of through-hole 2. The metallic substance obstructs through-hole 2 in the form of a double-headed rivet.

The diameter of the through-hole is generally from 15 to 100 μm, and preferably from 20 to 50 μm. The pitch of the through-holes is generally from 15 to 200 μm, and preferably from 40 to 100 μm.

Insulating film 1 which can be used in the present invention is not particularly limited in material as long as it possesses electrically insulating characteristics. The material of the insulating film can be selected according to the end use from a wide variety of resins, either thermosetting or thermoplastic, including polyester resins, epoxy resins, urethane resins, polystyrene resins, polyethylene resins, polyamide resins, polyimide resins, ABS resins, polycarbonate resins, and silicone resins. For example, elastomers, such as a silicone rubber, a urethane rubber, and a fluorine rubber, are preferably used in cases where flexibility is required; and heat-resistant resins, such as polyimide, polyether sulfone, and polyphenylene sulfide, are preferably used in cases where heat resistance is required.

The thickness of insulating film 1 is arbitrarily selected. From the viewpoint of precision and variability of film thickness and through-hole diameter, the film thickness is generally from 5 to 200 μm, and preferably from 10 to 100 μm.

Metallic substance 3 which is filled in the fine through-hole to form a conducting path and which forms bump-like projections 4 includes various metals, e.g., gold, silver, copper, tin, lead, nickel, cobalt, and indium, and various alloys of these metals. The metallic substance preferably does not have high purity, but preferably contains a slight amount of known organic and inorganic impurities. Alloys are preferably used as the metallic substance.

The conducting path can be formed by various techniques, such as sputtering, vacuum evaporation, and plating. In the case of plating, for example, the bump-like projection having a bottom area larger than the opening of the through-hole can be produced by prolonging the plating time.

Fine through-holes 2 can be formed in insulating film 1 by mechanical processes, such as punching, dry etching using a laser or plasma beam, etc., and chemical wet etching using chemicals or solvents. Etching can be carried out by, for example, an indirect etching process in which a mask of a desired shape, e.g., a circle, a square, a rhombus, etc., is placed on insulating film 1 in intimate contact and the film is treated via the mask; a dry etching process in which a condensed laser beam is irradiated on insulating film 1 in spots or a laser beam is irradiated on insulating film through a mask, and a direct etching process in which a pattern of fine through-holes is previously printed on insulating film 1 by using a photosensitive resist and the film is then subjected to wet etching. In order to make a finely patterned circuit, the dry etching process and the wet etching process are preferred. In particular, a dry etching process utilizing aggression by an ultraviolet laser beam, such as an eximar laser beam, is preferred for obtaining a high aspect ratio.

Figure 3:
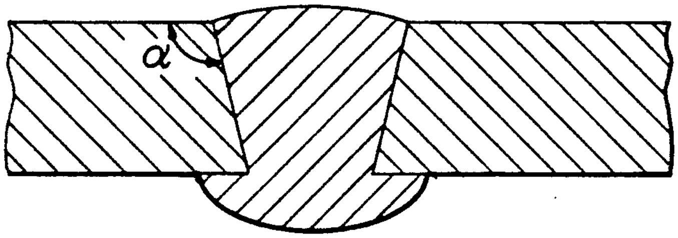
FIG. 3 illustrates a cross section of another embodiment of the present invention.

If the through-holes are formed by using a laser beam, the diameter of the through-hole on the side on which the laser beam is incident becomes larger than the diameter on the opposite side, as shown in FIG. 3. It is preferred that the through-holes are formed in such a manner that the angle $\alpha$ formed by the through-holes with the surface of the insulating film as shown in FIG. 1 and 3 falls within a range of $90°\pm20°$ and that the planar area of the through-holes is more than the square of the product of $1.25\times$the film thickness (film thickness$\times5/4)^2$. Such a structure is effective for the subsequent step of metal filling taking wettability of the hole wall by a plating solution into consideration.

Metallic projection(s) 4 formed on the opening(s) of through-hole 2 should have a larger bottom area than the planar area of through-hole 2, preferably a bottom area at least 1.1 times the planar area of through-hole 2, whereby the conducting path formed in through-hole 2 never falls off while exhibiting sufficient strength against a shearing force exerted in the film thickness direction and, thus, reliability of electrical connection can be improved.

The anisotropic conductive film according to the present invention can be produced, for example, by a process comprising:

(1) a step in which fine through-holes are provided in only an insulating film of a laminated film comprising an insulating film and a conductive layer (laminated either directly or via an adhesive layer), or a conductive layer is laminated on an insulating film previously having fine through-holes therein (the conductive layer should be laminated so that the fine pores may pierce the insulating film or be removed after laminating);

(2) a step in which the conductive layer positioned at the bottom of the through-holes is etched to form a rivet-like dent;

(3) a step in which a metallic substance is filled in the fine through-holes and the rivet-like dent, and further deposited to form bump-like projections by plating (e.g., electroplating or electroless plating); and (4) a step in which the conductive layer laminated on the insulating film is removed by chemical etching or electrolytic corrosion.

The formation of the bump-like metallic projections in step (3) above may be conducted after step (4).

In the case where the bump-like projections are formed on one side of the insulating film, the projections are preferably formed on the side where the diameter of the through-hole is smaller than that of the opposite side as shown in FIG. 3. Therefore, in the above step (1), the conductive layer is preferably provided on the side having a smaller through-hole diameter and a rivet-like dent is formed on the conductive layer.

In the formation of the bump-like metallic projections, it is preferred that the metallic substance is formed as microcrystalline. Where electroplating is performed at a high electrical current density, arborescent crystals are formed in some cases, failing to form bumps. Smooth and uniform projections can be formed by controlling a deposition rate of metallic crystals or controlling the kind of a plating solution or the temperature of a plating bath.

In order to form bump-like metallic projections having a larger bottom area than the opening area of through-holes, it is necessary to allow a metallic deposit to grow not only over the level of the opening, i.e., the surface of the insulating film, but to the transverse direction from the opening to make a rivet form. The height of the projections can be selected arbitrarily according to the pitch of the holes or the end use, and is generally 5 $\mu$m or more, preferably from 5 to 100 $\mu$m.

In cases where a conductive layer on the bottom side of the through-holes is removed and a rivet-like bump is formed there, the bottom area of the bump is preferably at least 1.1 times that of the through-hole. If the bottom area of the bump is smaller than 1.1 times that of the though-hole, the projection formed is less effective as a rivet-like bump, and desired effects cannot be obtained in some cases.

The present invention is now illustrated in greater detail by way of the following example, but it should be understood that the present invention is not deemed to be limited thereto.

EXAMPLE

A polyimide precursor solution was coated on a copper foil to a dry film thickness of 1 mil and cured to prepare a two-layer film composed of a copper foil and a polyimide film.

A KrF exima laser beam having an oscillation wavelength of 248 nm was irradiated on the polyimide film through a mask for dry etching to form fine through-holes having a diameter of 60 $\mu$m at a pitch of 200 $\mu$m per mm in an area of 8 $cm^2$.

A resist was coated on the copper foil and cured for insulation. The film having a resist layer was immersed in a chemical polishing solution at 50° C. for 2 minutes, followed by washing with water. The copper foil was connected to an electrode and soaked in a gold cyanide plating bath at 60° C., and a gold deposit was allowed to grow in the through-holes with the copper foil as a negative electrode. Electroplating was ceased when the gold deposit slightly projected from the polyimide film surface (projection height: 5 $\mu$m).

Finally, the resist layer was peeled off, and the copper foil was removed by dissolving with cupric chloride to obtain an anisotropic conductive film according to the present invention.

In the anisotropic conductive film of the present invention, the metallic substance filled as a conducting path is sufficiently adhered to the insulating film and undergoes no fall off. Thus, the fine through-holes sufficiently exhibit conductivity as essentially required as conducting paths to afford high reliability of electrical connection.

While the invention has been described in detail and with reference to specific examples thereof, it will be apparent to one skilled in the art that various changes and modifications can be made therein without departing from the spirit and scope thereof.

What is claimed is:

1. An anisotropic conductive film comprising an insulating film having fine through-holes independently piercing the film in the thickness direction of said insulating film, said through-holes forming an angle of 90°±20° with the surface of said insulating film such that the top opening of the through-holes is larger than the bottom opening and the planar area of the through-holes is more than the square of the product of 1.25 times the film thickness, said planar area being the smaller of the area of the top opening and the area of the bottom opening, each of the through-holes being filled with a metallic substance in such a manner that at least one end of each through-hole has a bump-like projection of said metallic substance having a bottom area larger than the opening of said through-hole whereby the conducting path formed in aid through-hole never falls off and exhibits sufficient strength against a shearing force exerted in the film thickness direction, thereby improving the reliability of the electrical connection.

2. The anisotropic conductive film as claimed in claim 1, wherein said metallic projection has a bottom area at least 1.1 times the planar area of said through-hole.

3. An anisotropic conductive film comprising an insulating film having fine through-holes independently piercing the film in the thickness direction of said insulating film, aid through-holes forming an angle of 90°±20° with the surface of said insulating film such that the bottom opening of the through-holes is larger than the top opening and the planar area of the through-holes is more than the square of the product of 1.25 times the film thickness, said planar area being the smaller of the area of the top opening and the area of the bottom opening, each of the through-holes being filled with a metallic substance in such a manner that at least one end of each through-hole has a bump-like projection of said metallic substance having a bottom area larger than the opening of said through-hole whereby the conducting path formed in said through-hole never falls off and exhibits sufficient strength against a shearing force exerted in the film thickness direction, thereby improving the reliability of the electrical connection.

4. The anisotropic conductive film as claimed in claim 3, wherein said metallic projection has a bottom area at least 1.1 times the planar area of said through-hole.

* * * * *